(12) United States Patent
Conley et al.

(10) Patent No.: US 9,997,888 B2
(45) Date of Patent: Jun. 12, 2018

(54) CONTROL OF A SPECTRAL FEATURE OF A PULSED LIGHT BEAM

(71) Applicant: Cymer, LLC, San Diego, CA (US)

(72) Inventors: Willard Earl Conley, San Diego, CA (US); Eric Anders Mason, San Diego, CA (US); Joshua Jon Thornes, San Diego, CA (US)

(73) Assignee: Cymer, LLC, San Diego, CA (US)

( * ) Notice: Subject to any disclaimer, the term of this patent is extended or adjusted under 35 U.S.C. 154(b) by 0 days. days.

(21) Appl. No.: 15/295,714

(22) Filed: Oct. 17, 2016

(65) Prior Publication Data
US 2018/0109068 A1    Apr. 19, 2018

(51) Int. Cl.
*G03B 27/54*    (2006.01)
*H01S 3/136*    (2006.01)
(Continued)

(52) U.S. Cl.
CPC .......... *H01S 3/136* (2013.01); *G03F 7/70141* (2013.01); *G03F 7/70191* (2013.01); *H01L 21/3065* (2013.01); *H01L 22/20* (2013.01); *H01S 3/0071* (2013.01); *H01S 3/08004* (2013.01); *H01S 3/106* (2013.01); *H01S 3/11* (2013.01)

(58) Field of Classification Search
CPC . G03F 7/70575; G03F 7/7085; G03F 7/70141
USPC ................... 355/52, 53, 67–71; 356/399–402
See application file for complete search history.

(56) References Cited

U.S. PATENT DOCUMENTS 5,661,547 A    8/1997    Aketagawa et al.
5,978,409 A    11/1999    Das et al.
(Continued)

FOREIGN PATENT DOCUMENTS

WO    2014000970 A1    1/2014

OTHER PUBLICATIONS

Alagna et al., "Optimum ArFi light source bandwidth for 10nm node logic imaging performance," SPIE Microlithography Symposium 2015, Optical Microlithography XXVIII, Feb. 24-Feb. 26, 2015, pp. 1-13.
(Continued)

*Primary Examiner* — Hung Henry Nguyen
(74) *Attorney, Agent, or Firm* — DiBerardino McGovern IP Group LLC (57) ABSTRACT

A spectral feature of a pulsed light beam produced by an optical source is controlled by a method. The method includes producing a pulsed light beam at a pulse repetition rate; directing the pulsed light beam toward a substrate received in a lithography exposure apparatus to expose the substrate to the pulsed light beam; modifying a pulse repetition rate of the pulsed light beam as it is exposing the substrate. The method includes determining an amount of adjustment to a spectral feature of the pulsed light beam, the adjustment amount compensating for a variation in the spectral feature of the pulsed light beam that correlates to the modification of the pulse repetition rate of the pulsed light beam. The method includes changing the spectral feature of the pulsed light beam by the determined adjustment amount as the substrate is exposed to thereby compensate for the variation in the spectral feature.

21 Claims, 7 Drawing Sheets

(51) Int. Cl.
  *H01S 3/11*     (2006.01)
  *H01S 3/00*     (2006.01)
  *H01S 3/08*     (2006.01)
  *H01S 3/106*    (2006.01)
  *H01L 21/3065*  (2006.01)
  *H01L 21/66*    (2006.01)
  *G03F 7/20*     (2006.01)

(56) References Cited

U.S. PATENT DOCUMENTS

| | | | |
|---|---|---|---|
| 6,061,382 | A  | 5/2000  | Govorkov et al. |
| 6,393,037 | B1 | 5/2002  | Basting et al. |
| 6,526,086 | B1 | 2/2003  | Wakabayashi et al. |
| 6,567,450 | B2 | 5/2003  | Myers et al. |
| 6,614,828 | B1 | 9/2003  | Basting et al. |
| 6,671,294 | B2 | 12/2003 | Kroyan et al. |
| 6,738,410 | B2 | 5/2004  | Partlo et al. |
| 6,853,653 | B2 | 2/2005  | Spangler et al. |
| 6,985,508 | B2 | 1/2006  | Knowles et al. |
| 7,154,928 | B2 | 12/2006 | Sandstrom et al. |
| 7,203,216 | B2 | 4/2007  | Ershov et al. |
| 7,366,219 | B2 | 4/2008  | Algots et al. |
| 7,382,815 | B2 | 6/2008  | Spangler et al. |
| 7,782,922 | B2 | 8/2010  | Hori et al. |
| 7,822,084 | B2 | 10/2010 | O'Brien et al. |
| 7,885,309 | B2 | 2/2011  | Ershov et al. |
| 7,899,095 | B2 | 3/2011  | Partlo |
| 8,126,027 | B2 | 2/2012  | Algots et al. |
| 8,144,739 | B2 | 3/2012  | Figueroa et al. |
| 8,520,186 | B2 | 8/2013  | Seong et al. |
| 8,705,004 | B2 | 4/2014  | Butler et al. |
| 2002/0012374 | A1 | 1/2002  | Basting et al. |
| 2003/0081192 | A1 | 5/2003  | Nishi |
| 2006/0244937 | A1 | 11/2006 | Nolscher et al. |
| 2006/0256314 | A1 | 11/2006 | Nolscher et al. |
| 2007/0297467 | A1 | 12/2007 | Fomenkov et al. |
| 2008/0232408 | A1 | 9/2008  | O'Brien et al. |
| 2008/0253408 | A1 | 10/2008 | Ishihara |
| 2008/0253413 | A1 | 10/2008 | Partlo |
| 2008/0285602 | A1 | 11/2008 | Nagai et al. |
| 2010/0157266 | A1 | 6/2010  | Zimmermann et al. |
| 2011/0122901 | A1 | 5/2011  | Sandstrom et al. |
| 2014/0104614 | A1* | 4/2014 | Rokitski ............ G01J 3/1809 356/402 |
| 2015/0070673 | A1* | 3/2015 | Lalovic ............ G03F 7/70041 355/67 |
| 2015/0168848 | A1 | 6/2015  | Tanaka et al. |
| 2015/0355025 | A1* | 12/2015 | Duffey ............ G01J 3/28 355/67 |
| 2016/0380402 | A1* | 12/2016 | O'Brien ............ G01B 11/02 359/342 |
| 2017/0179677 | A1 | 6/2017  | Thornes et al. |

OTHER PUBLICATIONS

Brunner et al., "Laser Bandwidth and Other Sources of Focus Blur in Lithography," Optical Microlithography XIX, Proc. of SPIE, vol. 6154, 2006, pp. 323-330.

Dunstan et al., "Active Spectral Control of DUV Light Sources for OPE Minimization," Optical Microlithography XIX, Proc. of SPIE, vol. 6154, Mar. 15, 2006, 9 pages.

Jacques et al., "Active Spectral-Control Techniques for Improving OPC," Solid State Technology, Dec. 2006, vol. 19, No. 12, 5 pages.

* cited by examiner

CONTROL OF A SPECTRAL FEATURE OF A PULSED LIGHT BEAM

CROSS REFERENCE TO RELATED APPLICATION

This application is related to U.S. application Ser. No. 15/295,280, filed on Oct. 17, 2016, which is incorporated herein by reference in its entirety.

TECHNICAL FIELD

The disclosed subject matter relates to controlling a spectral feature, such as, for example, bandwidth or wavelength, of a light beam output from an optical source that supplies light to a lithography exposure apparatus.

BACKGROUND

In semiconductor lithography (or photolithography), the fabrication of an integrated circuit (IC) requires a variety of physical and chemical processes performed on a semiconductor (for example, silicon) substrate (which is also referred to as a wafer). A photolithography exposure apparatus or scanner is a machine that applies a desired pattern onto a target portion of the substrate. The wafer is fixed to a stage so that the wafer generally extends along a plane defined by orthogonal $X_L$ and $Y_L$ directions of the scanner. The wafer is irradiated by a light beam, which has a wavelength in the deep ultraviolet (DUV) range. The light beam travels along an axial direction, which corresponds with the $Z_L$ direction of the scanner. The $Z_L$ direction of the scanner is orthogonal to the lateral $X_L$-$Y_L$ plane.

An accurate knowledge of spectral features or properties (for example, a bandwidth) of a light beam output from an optical source such as a laser is important in many scientific and industrial applications. For example, accurate knowledge of the optical source bandwidth is used to enable control of a minimum feature size or critical dimension (CD) in deep ultraviolet (DUV) optical lithography. The critical dimension is the feature size that is printed on a semiconductor substrate (also referred to as a wafer) and therefore the CD can require fine size control. In optical lithography, the substrate is irradiated by a light beam produced by an optical source. Often, the optical source is a laser source and the light beam is a laser beam.

SUMMARY

In some general aspects, a spectral feature of a pulsed light beam produced by an optical source is controlled by a method. The method includes producing, from the optical source, a pulsed light beam at a pulse repetition rate; directing the pulsed light beam toward a substrate received in a lithography exposure apparatus to expose the substrate to the pulsed light beam; modifying a pulse repetition rate of the pulsed light beam as it is exposing the substrate. The method includes determining an amount of adjustment to a spectral feature of the pulsed light beam, the adjustment amount compensating for a variation in the spectral feature of the pulsed light beam that correlates to the modification of the pulse repetition rate of the pulsed light beam. The method includes changing the spectral feature of the pulsed light beam by the determined adjustment amount as the pulsed light beam is exposing the substrate to thereby compensate for the variation in the spectral feature.

Implementations can include one or more of the following features. For example, the amount of adjustment to the spectral feature can be determined by: accessing a correlation recipe, the correlation recipe defining a relationship between the repetition rate and the spectral feature for the optical source; determining the spectral feature that correlates to the modified pulse repetition rate in the recipe; and calculating the adjustment amount of the spectral feature that offsets the spectral feature correlated to the modified pulse repetition rate.

The method can include creating the correlation recipe for the optical source prior to directing the pulsed light beam toward the substrate. The method can include creating the correlation recipe for the pulsed optical source in between a pair of bursts of pulses of the pulsed light beam.

The spectral feature of the pulsed light beam can be changed by adjusting one or more components of the optical source. The one or more components of the optical source can be adjusted by adjusting one or more optical components of a spectral feature selection apparatus that interact with the pulsed light beam. The one or more optical components of the spectral feature selection apparatus can be adjusted by rotating a prism of the spectral feature selection apparatus. The prism of the spectral feature selection apparatus can be rotated to thereby change the spectral feature by rotating the prism from a first stable equilibrium position to a second stable equilibrium position in a time that is less than or equal to 50 milliseconds. The prism of the spectral feature selection apparatus can be rotated by rotating the prism from a first angle to a second angle, wherein the first and second angles can be any angle in a 360° rotation.

The spectral feature of the pulsed light beam can be changed by changing the spectral feature in between bursts of pulses of the pulsed light beam.

The method can include receiving an instruction to modify the pulse repetition rate of the pulsed light beam as it is exposing the substrate by a particular value, wherein modifying the pulse repetition rate of the pulsed light beam includes modifying the repetition rate of the pulsed light beam by the particular value.

The spectral feature of the pulsed light beam can be changed by the determined adjustment amount as the pulsed light beam is exposing the substrate to thereby compensate for the spectral feature variation causes the spectral feature of the pulsed light beam to maintained within a predetermined stable range.

The spectral feature can be maintained in the predetermined stable range and a critical dimension of a feature formed in the substrate can be maintained to within a predetermined acceptable range.

The spectral feature can be the bandwidth of the pulsed light beam.

In other general aspects, a system includes an illumination system, a spectral feature selection apparatus, and a control system. The illumination system produces and directs a pulsed light beam toward a photolithography exposure apparatus. The illumination system includes an optical source that produces the pulsed light beam at a pulse repetition rate that is capable of being changed. The spectral feature selection apparatus is configured to select a spectral feature of the pulsed light beam. The spectral feature selection apparatus includes a set of optical components arranged in the path of the pulsed light beam. The control system is operatively connected to the optical source and to the spectral feature selection apparatus. The control system is configured to: control the repetition rate at which the pulsed light beam is produced including modifying the repetition rate of the pulsed light beam as it is exposing a substrate in the photolithography exposure apparatus; determine an amount of adjustment to a spectral feature of the pulsed light beam, the adjustment amount compensating for a variation in the spectral feature of the pulsed light beam that correlates to the modification of the pulse repetition rate of the pulsed light beam; and send a signal to the spectral feature selection apparatus to move at least one optical component to thereby change the spectral feature of the pulsed light beam by the determined adjustment amount as the pulsed light beam is exposing the substrate to thereby compensate for the spectral feature variation.

Implementations can include one or more of the following features. For example, the set of optical components of the spectral feature selection apparatus can include at least one prism. The control system can be configured to send a signal to a rapid actuator associated with the at least one prism to cause the prism to rotate to thereby change the spectral feature. The set of optical components of the spectral feature selection apparatus can include: a dispersive optical element arranged to interact with the pulsed light beam, and a plurality of prisms arranged in the path of the pulsed light beam between the dispersive optical element and the optical source.

The spectral feature selection apparatus can include an actuation system having at least one actuator associated with a prism and configured to rotate the associated prism to thereby adjust a spectral feature of the pulsed light beam.

The rapid actuator can include a rotation stage that rotates about a rotation axis and includes a region that is mechanically linked to the prism. The rotation stage can be configured to rotate about the rotation axis along a full 360° of angle of rotation.

The illumination system can include a beam preparation system configured to receive the pulsed light beam produced from the optical source and to direct the pulsed light beam toward the photolithography exposure apparatus.

DESCRIPTION

Figure 1:
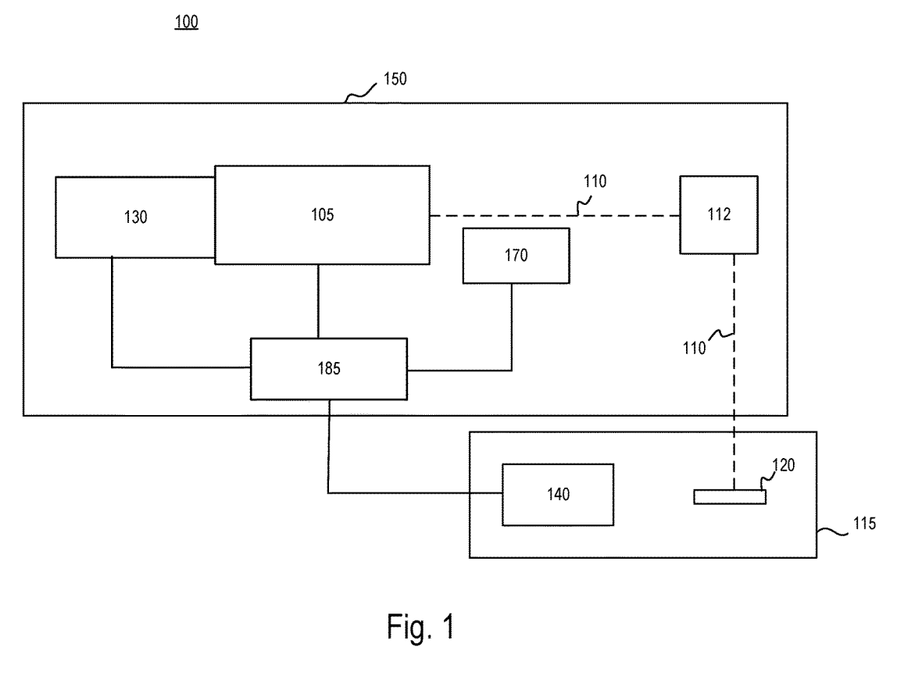
FIG. 1 is a block diagram of a photolithography system producing a pulsed light beam that is directed to a photolithography exposure apparatus.

Referring to FIG. 1, a photolithography system 100 includes an illumination system 150 that produces a pulsed light beam 110 having a wavelength that is nominally at a center wavelength and is directed to a photolithography exposure apparatus or scanner 115. The pulsed light beam 110 is used to pattern microelectronic features on a substrate or wafer 120 received in the scanner 115. The illumination system 150 includes an optical source 105 that produces the pulsed light beam 110 at a pulse repetition rate that is capable of being changed.

The illumination system 150 includes a spectral feature selection apparatus 130. The spectral feature selection apparatus 130 interacts with the light beam 110 produced by the optical source 105 and is configured to select one or more spectral features (such as the bandwidth or wavelength) of the pulsed light beam 110. The spectral feature selection apparatus 130 includes a set of optical components (shown in FIG. 4, for example) arranged in the path of the pulsed light beam 110. The illumination system 150 includes a control system 185 operatively connected to the pulsed optical source 105 and to the spectral feature selection apparatus 130. And, the scanner 115 includes a lithography controller 140 operatively connected to the control system 185 and components within the scanner 115.

The pulse repetition rate of the pulsed light beam 110 is the rate at which pulses of the light beam 110 are produced by the optical source 105. Thus, for example, the repetition rate of the pulsed light beam 110 is $1/\Delta t$, where $\Delta t$ is the time between the pulses. The control system 185 is generally configured to control the repetition rate at which the pulsed light beam 110 is produced including modifying the repetition rate of the pulsed light beam as it is exposing the wafer 120 in the photolithography exposure apparatus 115.

In some implementations, the scanner 115 triggers the optical source 105 (through the communication between the controller 140 and the control system 185) to produce the pulsed light beam 110, so the scanner 115 controls the repetition rate by way of the controller 140 and the control system 185. For example, the controller 140 sends a signal to the control system 185 to maintain the repetition rate of the light beam 110 within a particular range of acceptable rates. The scanner 115 generally maintains the repetition rate constant for each burst of pulses of the light beam 110. A burst of pulses of the light beam 110 can correspond to an exposure field on the wafer 120. The exposure field is the area of the wafer 120 that is exposed in one scan of an exposure slit or window within the scanner 115. A burst of pulses can include anywhere from 10 to 500 pulses, for example.

Customers who manage the scanner 115 wish to be able to modify the pulse repetition rate of the light beam 110 as it is being scanned across the wafer 120. Accordingly, the scanner 115 can also request (by way of the controller 140 and the control system 185) a change or modification to the repetition rate of the light beam 110 and such a change request can occur in between bursts of pulses. For example, the customer may prefer to operate at lower repetition rates to allow the customer to use fewer pulses per wafer 120, instead of simply attenuating the light beam 110 within the scanner 115.

Several performance characteristics of the illumination system 150 (such as the parameters of the light beam 110 produced by the illumination system 150) are sensitive to changes in the repetition rate. For example, one or more spectral features (such as the bandwidth or wavelength) of the light beam 110 can fluctuate or vary when the repetition rate of the light beam 110 is changed. For example, the bandwidth of the light beam 110 depends on the wavefront of the light beam 110, and the wavefront of the light beam 110 can become distorted when the repetition rate of the pulses of the light beam 110 are adjusted. The destabilization of the bandwidth leads to unacceptable variations in the critical dimension (CD) at the wafer 120 and therefore leads to unreliable performance from the illumination system 150. Moreover, the variations of the performance characteristics of the illumination system 150 can be different from one design of the illumination system 150 to another design of the illumination system 150. Thus, a single solution to stabilizing the performance characteristics of the illumination system 150 due to the adjustments of the repetition rate of the light beam 110 is not feasible.

Specifically, the critical dimension (CD) is the smallest feature size that can be printed on the wafer 120 by the system 100. The CD depends on the wavelength of the light beam 110. To maintain a uniform CD of the microelectronic features printed on the wafer 120, and on other wafers exposed by the system 100, the center wavelength of the light beam 110 should remain at an expected or target center wavelength or within a range of wavelengths around the target wavelength. Thus, in addition to maintaining the center wavelength at the target center wavelength or within a range of acceptable wavelengths about the target center wavelength, it is desirable to maintain the bandwidth of the light beam 110 (the range of wavelengths in the light beam 110) to within an acceptable range of bandwidths.

In order to maintain the bandwidth of the light beam 110 to an acceptable range, the control system 185 is configured to determine an amount of adjustment to the bandwidth of the pulsed light beam 110, where the adjustment to the bandwidth of the pulsed light beam 110 compensates for a change or variation in the bandwidth of the pulsed light beam 110 that is caused by a modification of the pulse repetition rate of the pulsed light beam 110. Additionally, the control system 185 is configured to send a signal to the spectral feature selection apparatus 130 to move at least one optical component of the apparatus 130 to thereby change the bandwidth of the pulsed light beam 110 by the determined adjustment amount as the pulsed light beam 110 is exposing the wafer 120 to thereby compensate for the bandwidth variation caused by the modification of the pulse repetition rate of the pulsed light beam 110.

The bandwidth of the pulsed light beam 110 can be changed in between any two bursts of pulses. Moreover, the time that it takes for the bandwidth to be changed from a first value to a second value and also to stabilize at the second value should be less than the time between the bursts of pulses. For example, if the period of time between bursts is 50 milliseconds (ms), then the total time to change the bandwidth from a first value to a second value and stabilize at the second value should be less than 50 ms. The control system 185 and the spectral feature selection apparatus 130 are designed to enable such a rapid change of the bandwidth, as discussed in detail below.

In some implementations, the scanner 115 does not know the value of the repetition rate of the light beam 110; rather, the scanner 115 merely provides a trigger to the pulsed optical source 105 (by way of the control system 185) to produce the pulses at a specific repetition rate. In other implementations, the scanner 115 or the illumination system 150 can monitor the pulse repetition rate by measuring a time between consecutive pulses of the light beam 110 and use this information to control or modify the repetition rate of the light beam 110. These measurements can be performed, for example, by a measurement (metrology) system 170.

The controller 140 of the scanner 115 sends a signal to the control system 185 to adjust or modify the repetition rate of the pulsed light beam 110 that is being scanned across the wafer 120. The signal sent to the control system 185 can cause the control system 185 to modify an electrical signal sent to the pulsed optical source 105. For example, if the pulsed optical source 105 includes a gas laser amplifier then the electrical signal provides a pulsed current to electrodes within one or more gas discharge chambers of the pulsed optical source 105.

Details about the photolithography system 100 are provided next. Specifically, with reference again to FIG. 1, the wafer 120 is placed on a wafer table constructed to hold the wafer 120 and connected to a positioner configured to accurately position the wafer 120 in accordance with certain parameters and under control of the controller 140.

The light beam 110 is directed through a beam preparation system 112, which can include optical elements that modify aspects of the light beam 110. For example, the beam preparation system 112 can include reflective and/or refractive optical elements, optical pulse stretchers, and optical apertures (including automated shutters).

Figure 2:
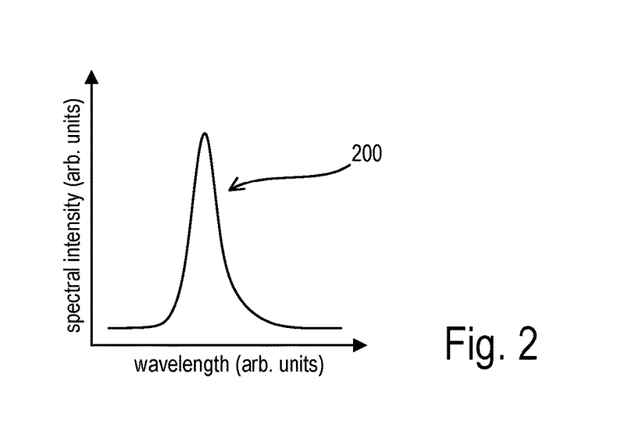
FIG. 2 is a graph of an exemplary optical spectrum of the pulsed light beam produced by the photolithography system of FIG. 1.

The pulses of the light beam 110 are centered around a wavelength that is in the deep ultraviolet (DUV) range, for example, with wavelengths of 248 nanometers (nm) or 193 nm. The size of the microelectronic features patterned on the wafer 120 depends on the wavelength of the pulsed light beam 110, with a lower wavelength resulting in a small minimum feature size or critical dimension. When the wavelength of the pulsed light beam 110 is 248 nm or 193 nm, the minimum size of the microelectronic features can be, for example, 50 nm or less. The bandwidth that is used for analysis and control of the pulsed light beam 110 can be the actual, instantaneous bandwidth of its optical spectrum 200 (or emission spectrum), which contains information on how the optical energy or power of the light beam 110 is distributed over different wavelengths (or frequencies), as shown in FIG. 2.

The photolithography system 100 can also include the metrology system 170, which can include a sub-system that measures one or more spectral features (such as the bandwidth or wavelength) of the light beam 110. Because of various disturbances applied to the photolithography system 100 during operation, the value of the spectral feature (such as the bandwidth or the wavelength) of the light beam 110 at the wafer 120 may not correspond to or match with the desired spectral feature (that is, the spectral feature that the scanner 115 expects). Thus, the spectral feature (such as a characteristic bandwidth) of light beam 110 is measured or estimated during operation by estimating a value of a metric from the optical spectrum so that an operator or an automated system (for example, a feedback controller) can use the measured or estimated bandwidth to adjust the properties of the optical source 105 and to adjust the optical spectrum of the light beam 110. The sub-system of the metrology system 170 measures the spectral feature (such as the bandwidth and/or the wavelength) of the light beam 110 based on this optical spectrum.

The metrology system 170 receives a portion of the light beam 110 that is redirected from a beam separation device that is placed in a path between the optical source 105 and the scanner 115. The beam separation device directs a first portion or percentage of the light beam 110 into the metrology system 170 and directs a second portion or percentage of the light beam 110 toward the scanner 115. In some implementations, the majority of the light beam 110 is directed in the second portion toward the scanner 115. For example, the beam separation device directs a fraction (for example, 1-2%) of the light beam 110 into the metrology system 170. The beam separation device can be, for example, a beam splitter.

The scanner 115 includes an optical arrangement having, for example, one or more condenser lenses, a mask, and an objective arrangement. The mask is movable along one or more directions, such as along an optical axis of the light beam 110 or in a plane that is perpendicular to the optical axis. The objective arrangement includes a projection lens and enables the image transfer to occur from the mask to the photoresist on the wafer 120. The illuminator system adjusts the range of angles for the light beam 110 impinging on the mask. The illuminator system also homogenizes (makes uniform) the intensity distribution of the light beam 110 across the mask.

The scanner 115 can include, among other features, the lithography controller 140, air conditioning devices, and power supplies for various electrical components. In addition to controlling the repetition rate of the pulses of the light beam 110 (discussed above), the lithography controller 140 controls how layers are printed on the wafer 120. The lithography controller 140 includes memory that stores information such as process recipes and also may store information about which repetition rates may be used or are preferable as described more fully below.

The wafer 120 is irradiated by the light beam 110. A process program or recipe determines the length of the exposure on the wafer 120, the mask used, as well as other factors that affect the exposure. During lithography, as discussed above, a plurality of pulses of the light beam 110 illuminates the same area of the wafer 120 to constitute an illumination dose. The number N of pulses of the light beam 110 that illuminate the same area can be referred to as the exposure window or slit and the size of the slit can be controlled by an exposure slit placed before the mask. In some implementations, the value of N is in the tens, for example, from 10-100 pulses. In other implementations, the value of N is greater than 100 pulses, for example, from 100-500 pulses.

One or more of the mask, the objective arrangement, and the wafer 120 can be moved relative to each other during the exposure to scan the exposure window across an exposure field. The exposure field is the area of the wafer 120 that is exposed in one scan of the exposure slit or window.

Figure 3:
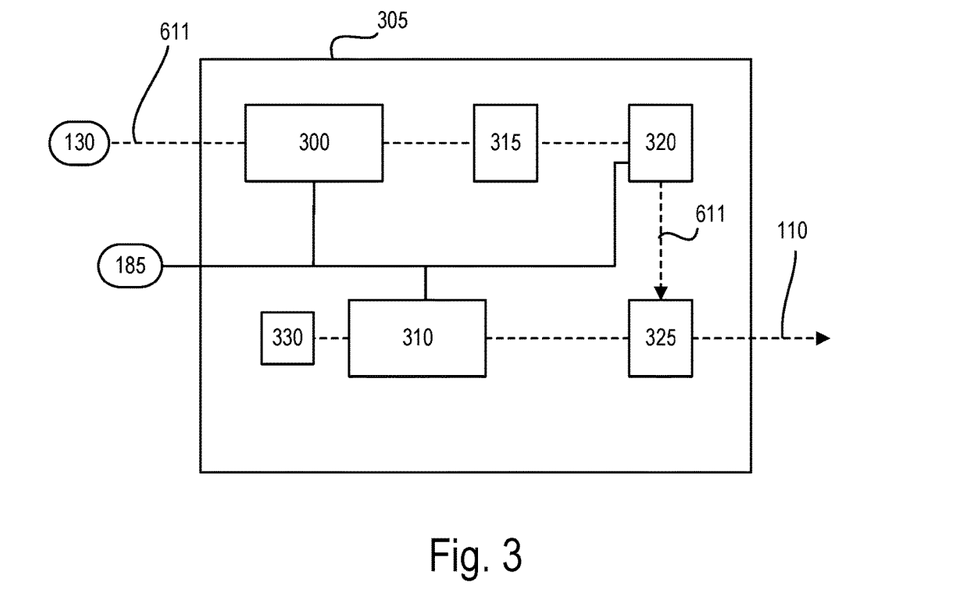
FIG. 3 is a block diagram of an exemplary optical source that can be used in the photolithography system of FIG. 1.

Referring to FIG. 3, an exemplary optical source 305 is a pulsed laser source that produces a pulsed laser beam as the light beam 110. The optical source 305 is a two-stage laser system that includes a master oscillator (MO) 300 that provides a seed light beam 611 to a power amplifier (PA) 310. The master oscillator 300 typically includes a gain medium in which amplification occurs and an optical feedback mechanism such as an optical resonator. The power amplifier 310 typically includes a gain medium in which amplification occurs when seeded with the seed laser beam from the master oscillator 300. If the power amplifier 310 is designed as a regenerative ring resonator then it is described as a power ring amplifier (PRA) and in this case, enough optical feedback can be provided from the ring design. The master oscillator 300 enables fine tuning of spectral parameters such as the center wavelength and the bandwidth at relatively low output pulse energies. The power amplifier 310 receives the output from the master oscillator 300 and amplifies this output to attain the necessary power for output to use in photolithography.

The master oscillator 300 includes a discharge chamber having two elongated electrodes, a laser gas that serves as the gain medium, and a fan circulating the gas between the electrodes. A laser resonator is formed between the spectral feature selection apparatus 130 on one side of the discharge chamber and receiving the seed light beam 611, and an output coupler 315 on a second side of the discharge chamber to output the seed light beam 611 to the power amplifier 310.

The optical source 305 can also include a line center analysis module (LAM) 320 that receives an output from the output coupler 315, and one or more beam modification optical systems 325 that modify the size and/or shape of the beam as needed. The line center analysis module 320 is an example of one type of measurement system that can be used to measure the wavelength (for example, the center wavelength) of the seed light beam.

The power amplifier 310 includes a power amplifier discharge chamber, and if it is a regenerative ring amplifier, the power amplifier also includes a beam reflector or beam turning device 330 that reflects the light beam back into the discharge chamber to form a circulating path. The power amplifier discharge chamber includes a pair of elongated electrodes, a laser gas that serves as the gain medium, and a fan for circulating the gas between the electrodes. The seed light beam is amplified by repeatedly passing through the power amplifier 310. The beam modification optical system 325 provides a way (for example, a partially-reflecting mirror) to in-couple the seed light beam and to out-couple a portion of the amplified radiation from the power amplifier to form the output light beam 110.

The laser gas used in the discharge chambers of the master oscillator 300 and the power amplifier 310 can be any suitable gas for producing a laser beam around the required wavelengths and bandwidth. For example, the laser gas can be argon fluoride (ArF), which emits light at a wavelength of about 193 nm, or krypton fluoride (KrF), which emits light at a wavelength of about 248 nm.

The line center analysis module 320 monitors the wavelength of the output of the master oscillator 300. The line center analysis module 320 can be placed at other locations within the optical source 305, or it can be placed at the output of the optical source 305.

Figure 4:
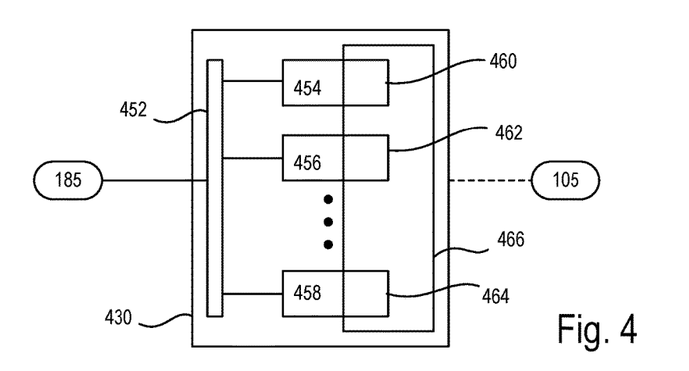
FIG. 4 is a block diagram of an exemplary spectral feature selection apparatus that can be used in the photolithography system of FIG. 1.

The spectral feature selection apparatus 130 receives the seed light beam 611 from the optical source 105 (or 305) and finely tunes the spectral output of the optical source 105, 305 based on the input from the control system 185. Referring to FIG. 4, an exemplary spectral feature selection apparatus 430 is shown that couples to light from the optical source 105, 305. In some implementations, the spectral feature selection apparatus 130 receives the light from the master oscillator 300 to enable the fine tuning of the spectral features such as wavelength and bandwidth within the master oscillator 300.

The spectral feature selection apparatus 430 can include a control module 452 that includes electronics in the form of any combination of firmware and software. The module 452 is connected to one or more actuation systems 454, 456, 458. Each of the actuation systems 454, 456, 458 can include one or more actuators that are connected to respective optical features 460, 462, 464 of an optical system 466. The optical features 460, 462, 464 are configured to adjust particular characteristics of the generated light beam 110 to thereby adjust the spectral feature of the light beam 110. The control module 452 receives a control signal from the control system 185, the control signal including specific commands to operate or control one or more of the actuation systems 454, 456, 458. The actuation systems 454, 456, 458 can be selected and designed to work cooperatively.

Each optical feature 460, 462, 464 is optically coupled to the light beam 110 produced by the optical source 105. Each of the actuators of the actuation systems 454, 456, 458 is a mechanical device for moving or controlling the respective optical features 460, 462, 464 of the optical system 466. The actuators receive energy from the module 452, and convert that energy into some kind of motion imparted to the optical features 460, 462, 464 of the optical system 466. For example, the actuation systems can be any one of force devices and rotation stages for rotating one or more of prisms of a beam expander. The actuation systems 454, 456, 458 can include, for example, motors such as stepper motors, valves, pressure-controlled devices, piezoelectric devices, linear motors, hydraulic actuators, voice coils, etc.

The spectral feature selection apparatus 130 can be designed like the apparatuses 130, 430, 530, 630, 730 shown in and described with respect to FIGS. 3A, 3B, 4A-4C, 5A-5C, 6A-6D, and 7 of U.S. application Ser. No. 15/295,280, filed on Oct. 17, 2016, which is incorporated herein by reference in its entirety.

Figure 5:
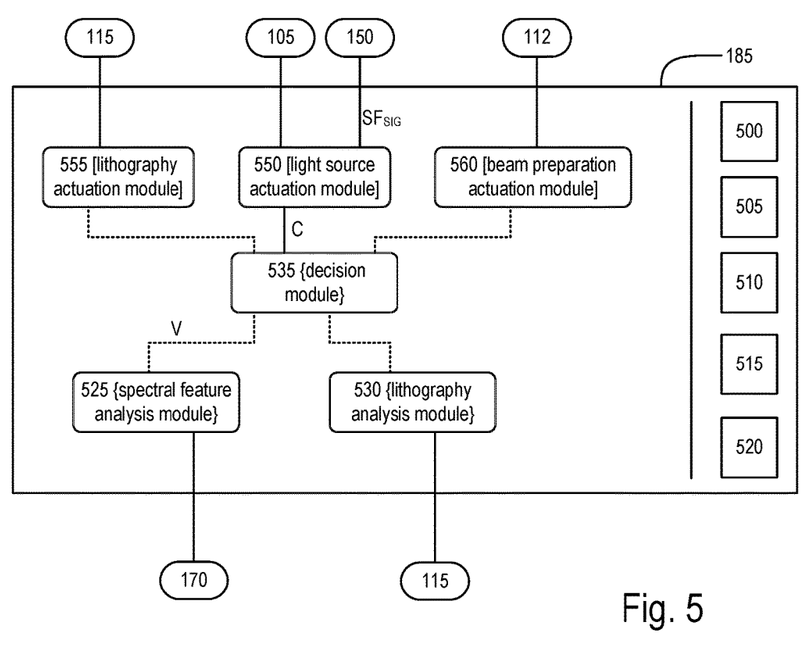
FIG. 5 is a block diagram of an exemplary control system that can be used in the photolithography system of FIG. 1.

Referring to FIG. 5, details about the control system 185 are provided that relate to the aspects of the system and method described herein. The control system 185 can include other features not shown in FIG. 5. In general, the control system 185 includes one or more of digital electronic circuitry, computer hardware, firmware, and software.

The control system 185 includes memory 500, which can be read-only memory and/or random access memory. Storage devices suitable for tangibly embodying computer program instructions and data include all forms of non-volatile memory, including, by way of example, semiconductor memory devices, such as EPROM, EEPROM, and flash memory devices; magnetic disks such as internal hard disks and removable disks; magneto-optical disks; and CD-ROM disks. The control system 185 can also include one or more input devices 505 (such as a keyboard, touch screen, microphone, mouse, hand-held input device, etc.) and one or more output devices 510 (such as a speaker or a monitor).

The control system 185 includes one or more programmable processors 515, and one or more computer program products 520 tangibly embodied in a machine-readable storage device for execution by a programmable processor (such as the processors 515). The one or more programmable processors 515 can each execute a program of instructions to perform desired functions by operating on input data and generating appropriate output. Generally, the processor 515 receives instructions and data from memory 500. Any of the foregoing may be supplemented by, or incorporated in, specially designed ASICs (application-specific integrated circuits).

The control system 185 includes, among other components, a spectral feature analysis module 525, a lithography analysis module 530, a decision module 535, a light source actuation module 550, a lithography actuation module 555, and a beam preparation actuation module 560. Each of these modules can be a set of computer program products executed by one or more processors such as the processors 515. Moreover, any of the modules 525, 530, 535 550, 555, 560 can access data stored within the memory 500.

The spectral feature analysis module 525 receives the output from the metrology system 170. The lithography analysis module 530 receives information from the lithography controller 140 of the scanner 115. The decision module 535 receives the outputs from the analyses modules (such as the modules 525 and 530) and determines which actuation module or modules need to be activated based on the outputs from the analyses modules. The light source actuation module 550 is connected to one or more of the optical source 105 and the spectral feature selection apparatus 130. The lithography actuation module 555 is connected to the scanner 115, and specifically to the lithography controller 140. The beam preparation actuation module 560 is connected to one or more components of the beam preparation system 112.

While only a few modules are shown in FIG. 5, it is possible for the control system 185 to include other modules. Additionally, although the control system 185 is represented as a box in which all of the components appear to be co-located, it is possible for the control system 185 to be made up of components that are physically remote from each other. For example, the light source actuation module 550 can be physically co-located with the optical source 105 or the spectral feature selection apparatus 130.

In general, the control system 185 receives at least some information about the light beam 110 from the metrology system 170, and the spectral feature analysis module 525 performs an analysis on the information to determine how to adjust one or more spectral features (for example, the bandwidth) of the light beam 110 supplied to the scanner 115. Based on this determination, the control system 185 sends signals to the spectral feature selection apparatus 130 and/or the optical source 105 to control operation of the optical source 105.

In general, the spectral feature analysis module 525 performs all of the analysis needed to estimate one or more spectral features (for example, the wavelength and/or the bandwidth) of the light beam 110. The output of the spectral feature analysis module 525 is an estimated value of the spectral feature.

The spectral feature analysis module 525 includes a comparison block connected to receive the estimated spectral feature and also connected to receive a spectral feature target value. In general, the comparison block outputs a spectral feature error value that represents a difference between the spectral feature target value and the estimated value. The decision module 535 receives the spectral feature error value and determines how best to effect a correction to the system 100 in order to adjust the spectral feature. Thus, the decision module 535 sends a signal to the light source actuation module 550, which determines how to adjust the spectral feature selection apparatus 130 (or the optical source 105) based on the spectral feature error value. The output of the light source actuation module 550 includes a set of actuator commands that are sent to the spectral feature selection apparatus 130. For example, light source actuation module 550 sends the commands to the spectral feature control module 452, which is connected to the spectral feature actuation systems 454, 456, 458.

The control system 185 causes the optical source 105 to operate at a given repetition rate. More specifically, the scanner 115 sends a trigger signal to the optical source 105 for every pulse (that is, on a pulse-to-pulse basis) and the time interval between those trigger signals can be arbitrary, but when the scanner 115 sends trigger signals at regular intervals then the rate of those signals is a repetition rate. The repetition rate can be a rate requested by the scanner 115.

The repetition rate of the pulses produced by the power amplifier 310 is determined by the repetition rate at which the master oscillator 300 is controlled by the control system 185, under the instructions from the controller 140 in the scanner 115. The repetition rate of the pulses output from the power amplifier 310 is the repetition rate seen by the scanner 115.

The photolithography system 100 can provide the user or customer (who operates the scanner 115) with the ability to choose any one of many repetition rates depending on the needs of a particular application. As discussed above, performance characteristics (for example, the spectral features such as the bandwidth of the light beam 110) may vary with the repetition rate.

Figure 6:
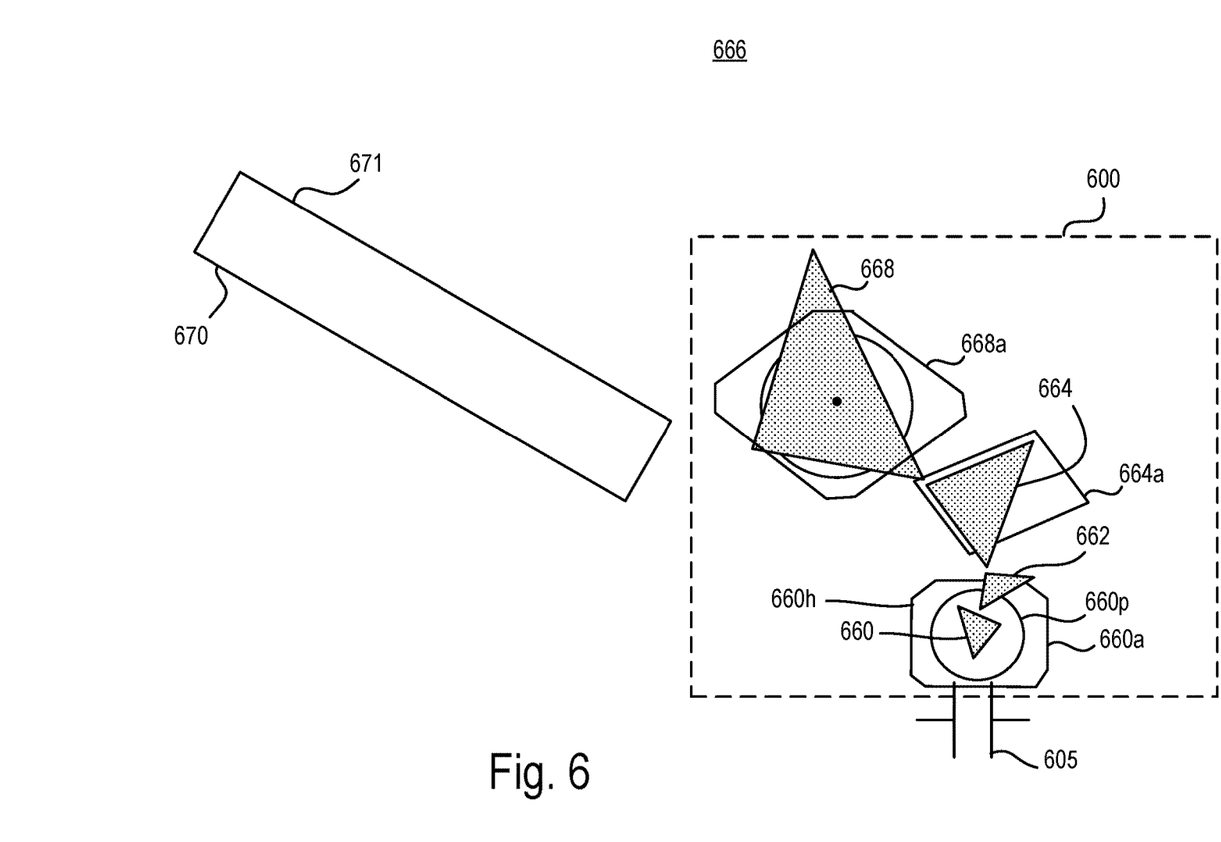
FIG. 6 is a block diagram of an exemplary spectral feature selection apparatus that can be used in the photolithography system of FIG. 1.

Referring to FIG. 6, an exemplary optical system 666 is a line narrowing module that includes a set of dispersive optical elements, such as a beam expander 600 made of four refractive optics (prisms 660, 662, 664, 668) and a diffractive optic (grating 670). The seed light beam 611 passes through an aperture 605 as it enters the line narrowing module 666 and also passes through the aperture 605 as it exits the line narrowing module 666.

The line narrowing module 666 is designed to adjust the wavelength of the seed light beam 611 that is produced within the resonator of the master oscillator 300 by adjusting an angle of incidence of the seed light beam 611 impinging on a diffractive surface 671 of the grating 670. Specifically, this can be done by adjusting an angular dispersion provided by the grating 670. One or more of the prisms 660, 662, 664, 668 and the grating 670 can be rotated to adjust the angle of incidence of the seed light beam 611 and therefore adjust the wavelength of the seed light beam 611 produced by the master oscillator 300.

The wavelength of the seed light beam 611 is selected by adjusting the angle at which the grating 670 reflects the seed light beam 611. The grating 670 reflects different spectral components of the light beam 611 within the emission band of the gain medium of the master oscillator 300. Those wavelength components that are reflected at larger angles from the grating 670 to the optical axis of the resonator of the master oscillator 300 suffer greater losses on subsequent round trips, and therefore the narrowing of the bandwidth is provided. Bandwidth narrowing occurs because those wavelength components of the light beam 611 emerging from the prisms at angles larger than a fixed acceptance angle of the resonator of the master oscillator 300 are eliminated from the light beam 611 as it resonates. Thus, the bandwidth of the light beam 611 is determined by the dispersion of the grating 670 as well as the magnification provided by the beam expander 600 (the four prisms 660, 662, 664, 668) because a smaller range of wavelengths emanate from the beam expander 600 at angles within the acceptance angle of the resonator of the master oscillator 300.

The grating 670 can be a high blaze angle Echelle grating, and the light beam 611 incident on the grating 670 at any angle that satisfies a grating equation will be reflected (diffracted). The grating equation provides the relationship between the spectral order of the grating 670, the diffracted wavelength, the angle of incidence of the light beam 611 onto the grating 670, the angle of exit of the light beam 611 diffracted off the grating 670, the vertical divergence of the light beam 611 incident onto the grating 670, and the groove spacing of the grating 670. Moreover, if the grating 670 is used such that the angle of incidence of the light beam 611 onto the grating 670 is equal to the angle of exit of the light beam 611 from the grating 670, then the grating 670 and the beam expander 600 are arranged in a Littrow configuration and the wavelength of the light beam 611 reflected from the grating 670 is the Littrow wavelength. It can be assumed that the vertical divergence of the light beam 611 incident onto the grating 670 is near zero. To reflect the nominal wavelength, the grating 670 is aligned, with respect to the light beam 610 incident onto the grating 670, so that the nominal wavelength is reflected back through the beam expander 600 to be amplified in the chamber of the master oscillator 300. The Littrow wavelength can then be tuned over the entire gain bandwidth of the master oscillator 300 by varying the angle of incidence of the light beam 611 onto the grating 670.

The prism 660 that is the farthest from the grating 670, and is also the smallest in size, is mounted on an actuator 660a that causes the prism 660 to rotate, and such rotation changes the optical magnification of the light beam 611 impinging upon the grating 670. The actuator 660a is a rotary stage that enables rapid control of the position of the prism 660 to enable a rapid adjustment to the bandwidth of the light beam 611 (and therefore the light beam 110). The rotary stage 660a can include a mounting surface (such as a plate 660p) on which the prism 660 is secured and a motor (not shown but mounted within a housing 660h) that is mechanically coupled to the mounting surface to enable the rotation of the mounting surface. The rotary stage 660a is able to rotate the prism 660 at a speed that enables the bandwidth of the light beam 611 and therefore the light beam 110 to be changed from a first bandwidth to a second bandwidth and also to stabilize at the second bandwidth within a time frame between bursts of pulses of the light beam 110. The rotary design of the actuator 660a imparts a purely rotational motion to mounting surface on which the prism 660 is mounted without the use of any linear motion or flexure motion that are found on prior actuators for the prism 660. Moreover, the use of a rotary stage 660a enables the prism 660 to be rotated about a full 360°, unlike the prior actuator that uses a linear stepper motor plus a flexure design (in which the prism 660 could only be rotated about the angle determined from the flexure).

In some implementations, the rotary stage 660a can use a direct drive stepper motor as the motor to rotate the mounting surface. A direct drive stepper motor is a conventional electromagnetic motor that uses a built-in step motor functionality for position control. In other implementations in which a higher resolution in motion may be needed, the rotary stage 660a can use a piezoelectric motor technology.

The rotary stage 660a can be a rotary stage that is controlled with a motor controller using a variable-frequency drive control method to provide the rapid rotation of the prism 660.

The adjustment to the bandwidth of the light beam 611 and light beam 110 using the rotation of the prism 660 can be considered to be a coarse adjustment; which means that it is able to adjust the bandwidth over a wider range of bandwidths, for example, a range of about 250 nm.

The next prism 662 that is closer to the grating 670, and has a size that is either larger than or equal to the size of the prism 660, can be fixed in space in some implementations. The next prism 664 that is closer to the grating 670 has a size that is either larger than or equal to the size of the prism 662.

The prism 664 can be mounted to an actuator 664a that causes the prism 664 to rotate, and such rotation of the prism 664 can provide for fine control of the wavelength of the seed light beam 611. The actuator 664a can be a rotary stage that is controlled with a piezoelectric motor. The piezoelectric motor operates by making use of the converse piezoelectric effect in which a material produces acoustic or ultrasonic vibrations in order to produce a linear or rotary motion.

The prism 668 that is closest to the grating 670 has a size that is either larger than or equal to the size of the prism 664 (the prism 668 is the largest prism of the beam expander 600). The prism 668 can be mounted to an actuator 668a that causes the prism 668 to rotate and such rotation of the prism 668 can provide for coarse control of the wavelength of the seed light beam 611. In some implementations, the actuator 668a is a rotary stage that includes a mounting surface to which the prism 668 is fixed and a motor that rotates the mounting surface. The motor of the actuator 668a can be a piezoelectric motor that is fifty times faster than a prior linear stepper motor and flexure combination design. The actuator 668a can also include a rotary encoder that provides angular position feedback for the control system 185.

Figure 7:
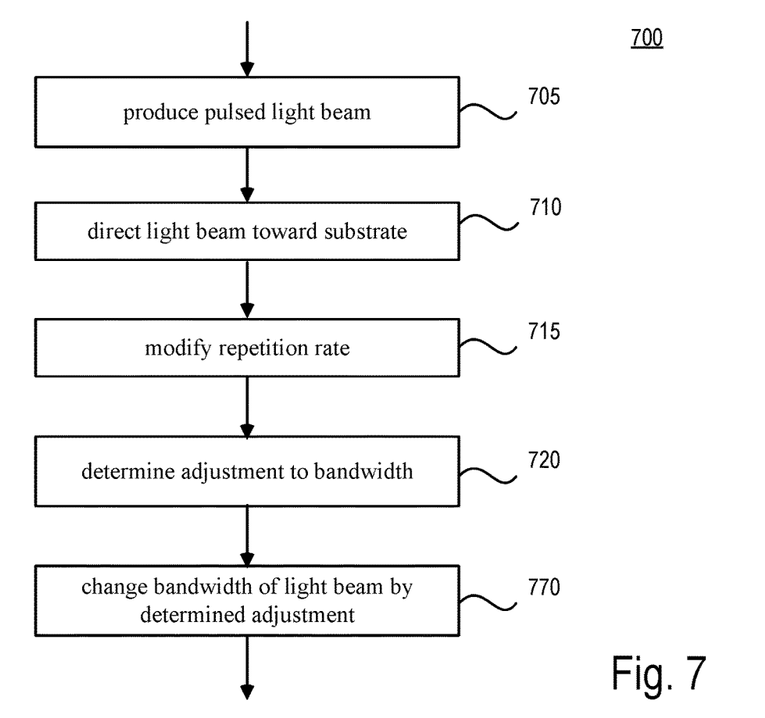
FIG. 7 is a flow chart of an exemplary procedure performed by the photolithography system of FIG. 1 to rapidly control a bandwidth of the pulsed light beam to compensate for a variation in a repetition rate of the pulsed light beam.

Referring to FIG. 7, the photolithography system 100 (under control of the control system 185 and optionally the controller 140) performs a procedure 700 for controlling the bandwidth of the light beam 110 produced by the optical source 105.

The procedure 700 includes producing, from the pulsed optical source 105, the pulsed light beam 110 at a pulse repetition rate (705). For example, the control system 185 can send signals to the optical source 105 to produce the pulsed light beam 110, and moreover, the controller 140 can provide the desired pulse repetition rate to the control system 185.

The pulsed light beam 110 is directed toward the substrate 120 received in the scanner 115 to expose the substrate 120 to the pulsed light beam 110 (710). For example, the light beam 110 emitted from the optical source 105 is directed to the scanner 115 by way of the beam preparation system 112.

The pulse repetition rate of the pulsed light beam 110 is modified as it is exposing the substrate 120 (715). For example, as the light beam 110 is exposing the substrate 120, the controller 140 sends a signal to the control system 185 to cause the optical source 105 to change the repetition rate of the pulses of the light beam 110, as discussed above. Thus, the control system 185 may receive an instruction from the controller 140 to modify the pulse repetition rate of the pulsed light beam 110 as it is exposing the substrate 120 by a particular value. In this way, the control system 185 determines how to adjust the signal output from the light source actuation module 550 based on the requested.

Next, an amount of adjustment to a bandwidth of the pulsed light beam 110 is determined (720), where such adjustment amount compensates for a variation in the bandwidth of the pulsed light beam 110 that is caused by the modification of the pulse repetition rate of the pulsed light beam 110. The bandwidth of the pulsed light beam 110 is changed by this determined adjustment amount as the pulsed light beam 110 is exposing the substrate 120 to thereby compensate for the bandwidth variation (770).

Figure 8:
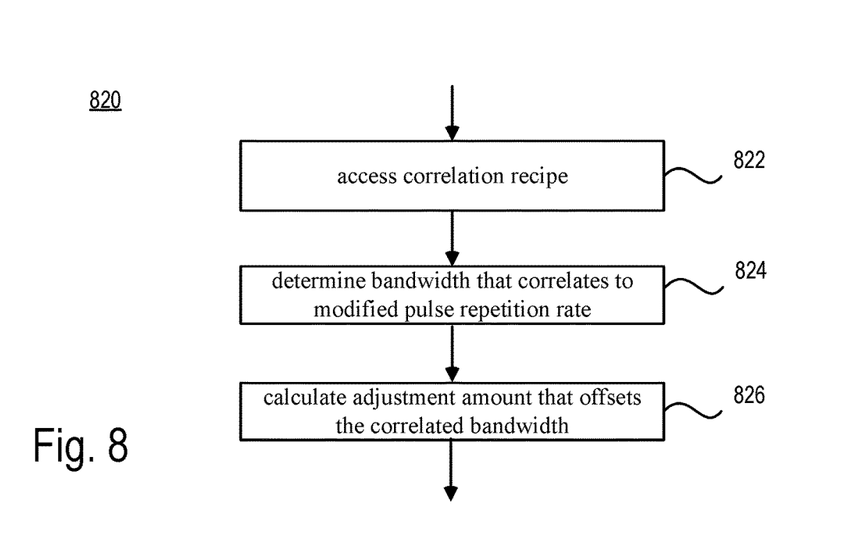
FIG. 8 is a flow chart of an exemplary procedure performed by the photolithography system of FIG. 1 to determine an adjustment to the bandwidth of the pulsed light beam.

In some implementations, the control system 185 determines the amount of adjustment to the bandwidth of the pulsed light beam 110 (720) by performing an exemplary procedure 820. The procedure 820 includes accessing a correlation recipe between the repetition rate and the bandwidth (822), determining the bandwidth that correlates to the modified pulse repetition rate in the recipe (824), and calculating the adjustment amount of the bandwidth that offsets the bandwidth correlated to the modified pulse repetition rate (826).

The control system 185 accesses the correlation recipe (822) that can be stored within memory 500. The correlation recipe defines a correlation between the repetition rate and the bandwidth for that optical source 105. For example, the correlation recipe could indicate that the light beam 110 has a particular bandwidth for a specific repetition rate, and the correlation recipe can also indicate how the bandwidth of the light beam 110 changes as the repetition rate is modified. For example, with reference to FIG. 9, a graph 900 (dashed line) shows a first exemplary correlation recipe, which is the relationship between the bandwidth of the light beam 110 and the repetition rate of the light beam 110 for a first optical source 105a. A graph 950 (dot-dashed line) shows a second distinct exemplary correlation recipe, which is the relationship between the bandwidth of the light beam 110 and the repetition rate of the light beam 110 for a second optical source 105b.

Figure 9:
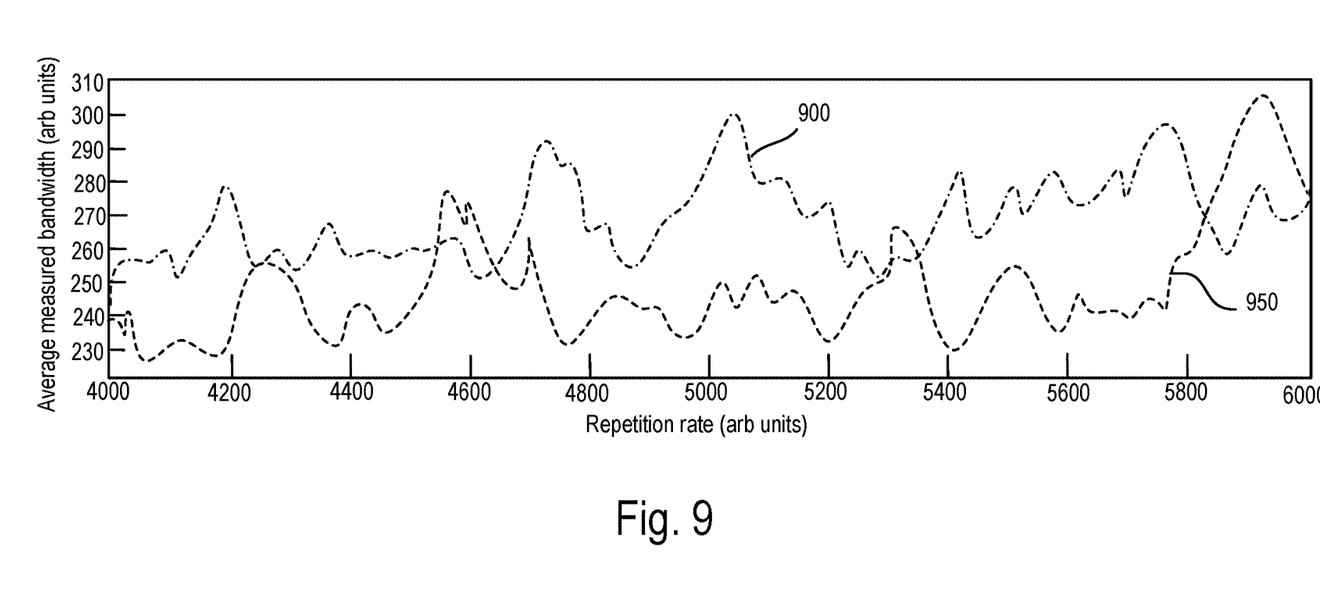
FIG. 9 is an exemplary graph showing the relationship between a bandwidth of the pulsed light beam and a repetition rate for two different optical sources.

In some implementations, the correlation recipe such as 900 or 950 is created for the respective pulsed optical source 105a, 105b prior to directing the pulsed light beam 110 that is produced by that optical source toward the substrate 120. In other implementations, the correlation recipe such as 900 or 950 is created for the respective optical source 105a, 105b during the time that lapses in between a pair of bursts of pulses of the pulsed light beam 110. The correlation recipe can be pre-loaded into memory 500 at the time that the optical source 105 is manufactured and/or updated during maintenance, or while the optical source 105 is operating.

The correlation recipe is determined by measuring the values of the bandwidth of the light beam 110 produced by the optical source 105 as the repetition rate of the light beam 110 is modified. The bandwidth of the light beam 110 can be measured by the metrology system 170.

Figure 10:
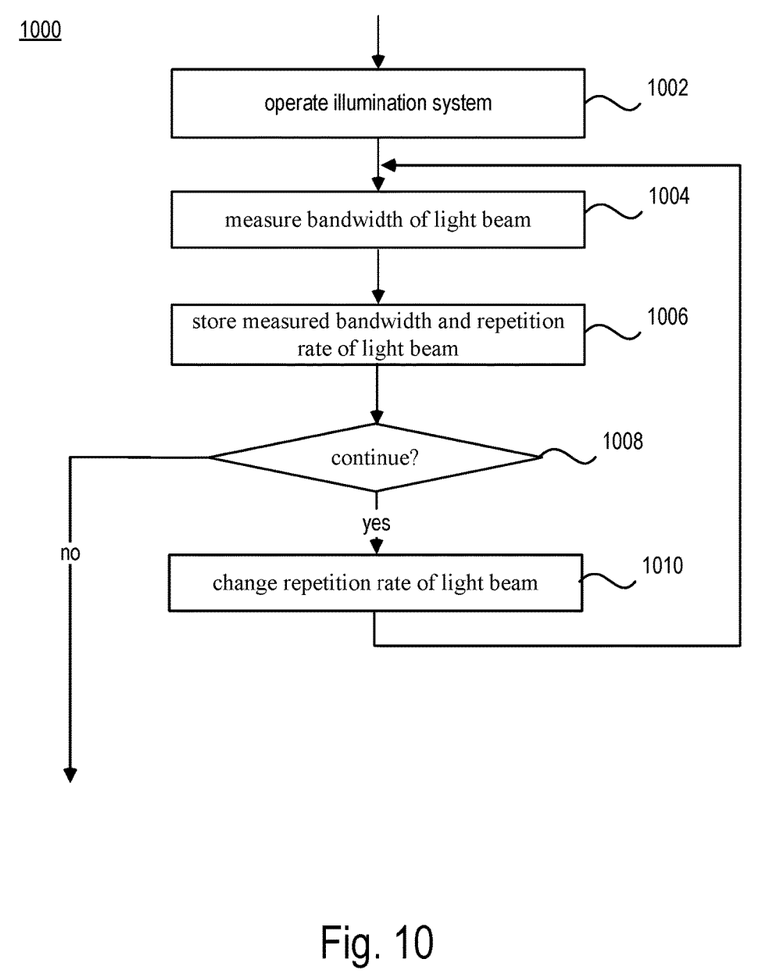
FIG. 10 is a flow chart of an exemplary procedure for operating the photolithography system of FIG. 1.

For example, with reference to FIG. 10, the correlation recipe can be determined or created by performing a procedure 1000. Initially, the illumination system 150 is operated at a repetition rate R while it is online but not while its output (the pulsed light beam 110) is being used by the scanner 115 (1002). Next, one or more performance parameters (such as spectral features, for example, the bandwidth) of the optical source 105 are measured by the illumination system 150 while the illumination system 150 is operating at the repetition rate R (1004). The measured performance parameters and the repetition rate R at which the performance parameters are measured are stored, for example, within memory 500 (1006).

If the illumination system 150 has been operated at all of the repetition rates R of interest (1008) then the procedure 1000 is completed for that illumination system 150. Otherwise the repetition rate R is changed to a new repetition rate (1010) and the one or more performance parameters of the optical source 105, for example, the bandwidth of the light beam 110, are measured by the illumination system 150 (1004). The new repetition rate R can be obtained by incrementing the immediately prior value by a fixed amount, or the value of the repetition rate R can be changed using other methods including decreasing the repetition rate R by a fixed amount, increasing or decreasing the repetition rate R by a variable or random amount, or by testing values of the repetition rate R that are expected to be of greatest interest.

The illumination system 150 can perform this procedure 1000 in a relatively short period of time, for example, on the order of a minute. Moreover, the illumination system 150 can be configured to perform this procedure 1000 for varying resolutions in order to control the overall duration of the procedure 1000 or to provide more refined correlation between the bandwidth and the repetition rate R. For example, the repetition rate R could be incremented by 10

Hz at 1010 for a high resolution analysis or correlation, or the repetition rate R could be incremented by 20 Hz at 1010 for a lower resolution analysis or correlation.

The bandwidth of the pulsed light beam 110 can be changed by the determined adjustment amount (770) at least in part by adjusting one or more optical components of the spectral feature selection apparatus 130. For example, the control system 185 can determine an adjustment signal to send to the light source actuation module 550, such signal instructing the module 452 to send specific signals to one or more of the actuation systems 454, 456, 468 to thereby modify one or more optical features 460, 462, 464. The bandwidth can be rapidly changed (770) by rotating the prism 660 with the rapid actuator 660a. Moreover, the bandwidth can be rapidly changed (770) in a time that is less than or equal to the time between bursts of pulses of the pulsed light beam 110. For example, the prism 660 is rotated from a first stable equilibrium position to a second stable equilibrium position in a time that is less than or equal to 50 milliseconds. Because the rapid actuator 660a is a rotation stage, it is possible for the prism 660 to be rotated to any angle within a full 360° rotation range.

By changing the bandwidth of the pulsed light beam 110 by the determined adjustment amount as the pulsed light beam is exposing the substrate, the photolithography system 100 is able to compensate for the variation in the bandwidth of the pulsed light beam 110 that is caused by the modification of the pulse repetition rate of the pulsed light beam 110 and the bandwidth of the pulsed light beam 110 can therefore be maintained within a predetermined stable range even if the repetition rate of the light beam 110 is changed during scanning. Moreover, by maintaining the bandwidth in the predetermined stable range, the critical dimension of a feature formed in the substrate 120 can also be maintained to within a predetermined acceptable range.

Other implementations are within the scope of the following claims.

For example, in other implementations, the prism 662 is mounted to its own actuator 662a that causes the prism 662 to rotate, and such rotation changes the angle of incidence of the light beam 611 impinging upon the grating 670 and can be used to provide for fine control of the wavelength of the light beam 611. The actuator 662a can be a piezoelectric rotation stage. In these other implementations, the prism 664 can be mounted to an actuator 664a that provides for fine control of the bandwidth of the light beam 611. Such an actuator 664a could be a stepper motor rotary stage.

In other implementations, the prism 660 can be mounted so that its moment axis does not align with the rotation axis of the actuator 662a. In these implementations, the prism axis is offset from the axis of the actuator 662a along a direction perpendicular to the rotation axis of the actuator 662a. An extension arm can be mounted at one end to the rotation axis of the actuator 662a and at a second end to the moment axis of the prism 660.

What is claimed is:

1. A method of controlling a spectral feature of a pulsed light beam produced by an optical source, the method comprising:
   producing, from the optical source, a pulsed light beam at a pulse repetition rate;
   directing the pulsed light beam toward a substrate received in a lithography exposure apparatus to expose the substrate to the pulsed light beam;
   receiving an instruction to modify a pulse repetition rate of the pulsed light beam as the pulsed light beam is exposing the substrate;
   modifying the pulse repetition rate of the pulsed light beam as it is exposing the substrate based on the received instruction;
   determining a variation in the spectral feature of the pulsed light beam that correlates with the modification of the pulse repetition rate of the pulsed light beam;
   determining an amount of adjustment to a spectral feature of the pulsed light beam, the adjustment amount compensating for the determined variation in the spectral feature of the pulsed light beam that correlates to the modification of the pulse repetition rate of the pulsed light beam; and
   compensating for the variation in the spectral feature caused by the modification of the pulse repetition rate by changing the spectral feature of the pulsed light beam by the determined adjustment amount as the pulsed light beam is exposing the substrate.

2. The method of claim 1, wherein determining the amount of adjustment to the spectral feature comprises:
   accessing a correlation recipe, the correlation recipe defining a relationship between the repetition rate and the spectral feature for the optical source;
   determining the spectral feature that correlates to the modified pulse repetition rate in the recipe; and
   calculating the adjustment amount of the spectral feature that offsets the spectral feature correlated to the modified pulse repetition rate.

3. The method of claim 2, further comprising creating the correlation recipe for the optical source prior to directing the pulsed light beam toward the substrate.

4. The method of claim 2, further comprising creating the correlation recipe for the pulsed optical source in between a pair of bursts of pulses of the pulsed light beam.

5. The method of claim 1, wherein changing the spectral feature of the pulsed light beam comprises adjusting one or more components of the optical source.

6. The method of claim 5, wherein adjusting the one or more components of the optical source comprises adjusting one or more optical components of a spectral feature selection apparatus that interact with the pulsed light beam including rotating a prism of the spectral feature selection apparatus.

7. The method of claim 6, wherein rotating the prism of the spectral feature selection apparatus to thereby change the spectral feature comprises rotating the prism from a first stable equilibrium position to a second stable equilibrium position in a time that is less than or equal to 50 milliseconds.

8. The method of claim 6, wherein rotating the prism of the spectral feature selection apparatus comprises rotating the prism from a first angle to a second angle, wherein the first and second angles can be any angle in a 360° rotation.

9. The method of claim 1, wherein changing the spectral feature of the pulsed light beam comprises changing the spectral feature in between bursts of pulses of the pulsed light beam.

10. The method of claim 1, wherein:
   receiving the instruction to modify the pulse repetition rate of the pulsed light beam comprises receiving the instruction to modify the pulse repetition rate by a particular value, and
   modifying the pulse repetition rate of the pulsed light beam comprises modifying the repetition rate of the pulsed light beam by the particular value.

11. The method of claim 1, wherein changing the spectral feature of the pulsed light beam by the determined adjustment amount as the pulsed light beam is exposing the substrate to thereby compensate for the spectral feature variation causes the spectral feature of the pulsed light beam to be maintained within a predetermined stable range.

12. The method of claim 11, wherein maintaining the spectral feature in the predetermined stable range also maintains a critical dimension of a feature formed in the substrate to within a predetermined acceptable range.

13. The method of claim 1, wherein the spectral feature is the bandwidth of the pulsed light beam.

14. A system comprising:
   an illumination system that produces and directs a pulsed light beam toward a photolithography exposure apparatus, the illumination system including an optical source that produces the pulsed light beam at a pulse repetition rate that is capable of being changed;
   a spectral feature selection apparatus configured to select a spectral feature of the pulsed light beam, the spectral feature selection apparatus comprising a set of optical components arranged in the path of the pulsed light beam; and
   a control system operatively connected to the optical source and to the spectral feature selection apparatus, the control system configured to:
      receive a request to modify a repetition rate at which the pulsed light beam is produced while the pulsed light beam is exposing a substrate in the photolithography exposure apparatus;
      send a control signal to the illumination system to thereby modify the repetition rate of the pulsed light beam as it is exposing the substrate in the photolithography exposure apparatus;
      determine a variation in the spectral feature of the pulsed light beam that correlates with the modification of the pulse repetition rate of the pulsed light beam;
      determine an amount of adjustment to a spectral feature of the pulsed light beam, the adjustment amount compensating for the determined variation in the spectral feature of the pulsed light beam that correlates to the modification of the pulse repetition rate of the pulsed light beam; and
      send a signal to the spectral feature selection apparatus to move at least one optical component to thereby change the spectral feature of the pulsed light beam by the determined adjustment amount as the pulsed light beam is exposing the substrate to thereby compensate for the spectral feature variation.

15. The system of claim 14, wherein the set of optical components of the spectral feature selection apparatus comprises at least one prism, and the control system is configured to send a signal to a rapid actuator associated with the at least one prism to cause the prism to rotate to thereby change the spectral feature.

16. The system of claim 15, wherein the set of optical components of the spectral feature selection apparatus comprises:
   a dispersive optical element arranged to interact with the pulsed light beam, and
   a plurality of prisms arranged in the path of the pulsed light beam between the dispersive optical element and the optical source.

17. The system of claim 15, wherein the spectral feature selection apparatus comprises an actuation system comprising at least one actuator associated with a prism and configured to rotate the associated prism to thereby adjust a spectral feature of the pulsed light beam.

18. The system of claim 15, wherein the rapid actuator comprises a rotation stage that rotates about a rotation axis and includes a region that is mechanically linked to the prism.

19. The system of claim 18, wherein the rotation stage is configured to rotate about the rotation axis along a full 360° of angle of rotation.

20. The system of claim 14, wherein the illumination system comprises a beam preparation system configured to receive the pulsed light beam produced from the optical source and to direct the pulsed light beam toward the photolithography exposure apparatus.

21. The system of claim 14, wherein the spectral feature is the bandwidth of the pulsed light beam.

* * * * *